United States Patent
Brodsky et al.

(10) Patent No.: US 8,198,169 B2
(45) Date of Patent: Jun. 12, 2012

(54) DEEP TRENCH CAPACITOR IN A SOI SUBSTRATE HAVING A LATERALLY PROTRUDING BURIED STRAP

(75) Inventors: MaryJane Brodsky, Salt Point, NY (US); Kangguo Cheng, Guilderland, NY (US); Herbert L. Ho, New Windsor, NY (US); Paul C. Parries, Wappingers Falls, NY (US); Kevin R. Winstel, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/974,451

(22) Filed: Dec. 21, 2010

(65) Prior Publication Data

US 2011/0092043 A1 Apr. 21, 2011

Related U.S. Application Data

(62) Division of application No. 12/016,312, filed on Jan. 18, 2008, now Pat. No. 7,888,723.

(51) Int. Cl.
*H01L 21/425* (2006.01)
(52) U.S. Cl. .. 438/389; 438/386; 438/514; 257/E21.018
(58) Field of Classification Search ............. 257/304, 257/E27.092, E21.011, E21.018; 438/386, 438/389, 514
See application file for complete search history.

(56) References Cited

U.S. PATENT DOCUMENTS

| | | | |
|---|---|---|---|
| 5,466,636 A | 11/1995 | Cronin et al. | |
| 5,792,685 A | 8/1998 | Hammerl et al. | |
| 5,804,851 A | 9/1998 | Noguchi et al. | |
| 5,827,765 A | 10/1998 | Stengl et al. | |
| 5,844,266 A | 12/1998 | Stengl et al. | |
| 5,893,735 A | 4/1999 | Stengl et al. | |
| 6,140,673 A | 10/2000 | Kohyama | |
| 6,340,615 B1 | 1/2002 | Iyer et al. | |
| 6,486,024 B1 * | 11/2002 | Tews et al. | 438/249 |
| 6,635,525 B1 | 10/2003 | Mandelman et al. | |
| 6,812,091 B1 | 11/2004 | Gruening et al. | |
| 6,815,749 B1 | 11/2004 | Mandelman et al. | |
| 6,881,620 B1 * | 4/2005 | Lai et al. | 438/243 |
| 6,906,372 B2 | 6/2005 | Yamada et al. | |
| 6,913,968 B2 | 7/2005 | Cheng et al. | |
| 6,964,897 B2 | 11/2005 | Bard et al. | |
| 6,967,136 B2 | 11/2005 | Akatsu et al. | |
| 6,969,648 B2 | 11/2005 | Cheng et al. | |
| 7,115,934 B2 | 10/2006 | Cheng et al. | |
| 7,129,130 B2 * | 10/2006 | Adkisson et al. | 438/243 |

(Continued)

*Primary Examiner* — Allan R Wilson
(74) *Attorney, Agent, or Firm* — Scully, Scott, Murphy & Prsser, P.C.; Joseph P. Abate, Esq.

(57) ABSTRACT

A deep trench is formed to a depth midway into a buried insulator layer of a semiconductor-on-insulator (SOI) substrate. A top semiconductor layer is laterally recessed by an isotropic etch that is selective to the buried insulator layer. The deep trench is then etched below a bottom surface of the buried insulator layer. Ion implantation is performed at an angle into the deep trench to dope the sidewalls of the deep trench beneath the buried insulator layer, while the laterally recessed sidewalls of the top semiconductor layer are not implanted with dopant ions. A node dielectric and trench fill materials are deposited into the deep trench. A buried strap has an upper buried strap sidewall that is offset from a lower buried strap sidewall and a deep trench sidewall.

12 Claims, 13 Drawing Sheets

U.S. PATENT DOCUMENTS

| | | |
|---|---|---|
| 7,132,324 B2 | 11/2006 | Cheng et al. |
| 7,138,677 B2 | 11/2006 | Gutsche et al. |
| 7,153,738 B2 | 12/2006 | Cheng et al. |
| 7,170,126 B2 | 1/2007 | Cheng et al. |
| 7,229,877 B2 | 6/2007 | Cheng et al. |
| 7,247,536 B2 | 7/2007 | Cheng et al. |
| 7,256,439 B2 | 8/2007 | Cheng et al. |
| 7,560,356 B2 * | 7/2009 | Lee .................... 438/386 |
| 2002/0195637 A1 | 12/2002 | Kokubun |
| 2005/0059214 A1 | 3/2005 | Cheng et al. |
| 2005/0164447 A1 | 7/2005 | Cheng et al. |
| 2006/0091442 A1 * | 5/2006 | Adkisson et al. ......... 257/301 |
| 2006/0141732 A1 * | 6/2006 | Hyun .................... 438/389 |
| 2006/0202249 A1 | 9/2006 | Cheng et al. |
| 2007/0077702 A1 | 4/2007 | Cheng et al. |
| 2007/0080440 A1 | 4/2007 | Cheng et al. |
| 2007/0117307 A1 | 5/2007 | Cheng et al. |
| 2007/0158725 A1 | 7/2007 | Cheng et al. |
| 2007/0172965 A1 | 7/2007 | Cheng et al. |
| 2007/0210363 A1 | 9/2007 | Cheng et al. |
| 2007/0254430 A1 | 11/2007 | Cheng |
| 2007/0267671 A1 | 11/2007 | Cheng et al. |
| 2008/0083941 A1 | 4/2008 | Cheng et al. |
| 2009/0079027 A1 | 3/2009 | Cheng et al. |

* cited by examiner

DEEP TRENCH CAPACITOR IN A SOI SUBSTRATE HAVING A LATERALLY PROTRUDING BURIED STRAP

CROSS REFERENCE TO RELATED APPLICATION

This application is a divisional of U.S. patent application Ser. No. 12/016,312, filed Jan. 18, 2008 the entire content and disclosure of which is incorporated herein by reference.

FIELD OF THE INVENTION

The present invention relates to semiconductor structures, and particularly to a deep trench capacitor in a semiconductor-on-insulator (SOI) substrate having a laterally protruding buried strap and an ion implanted buried plate, and methods of manufacturing the same employing angled ion implantation and a lateral recess etch of a top semiconductor layer.

BACKGROUND OF THE INVENTION

Deep trenches, typically having a depth exceeding 1 micron in contrast to shallow trenches having a depth less than 1 micron, are employed in the semiconductor industry to provide a variety of useful devices including a deep trench capacitor. The deep trenches may be utilized in a stand-alone semiconductor circuit such as a dynamic random access memory (DRAM) circuit to provide deep trench capacitors, or may be utilized as an embedded circuit component of a semiconductor chip that also includes other semiconductor circuits such as a processor core or other logic circuits. Particularly, embedded capacitors employing a deep trench are employed to enable an embedded memory device, e.g., an embedded dynamic random access memory (eDRAM) cell, a passive component of a radio frequency (RF) circuit, and decoupling capacitors that provide a stable voltage supply in a semiconductor circuit.

Semiconductor-on-insulator (SOI) substrates are employed in the semiconductor industry for performance benefits due to reduced capacitive coupling between semiconductor devices and the bulk portion of the substrate provided by a buried insulator layer. High performance logic chips are frequently manufactured on an SOI substrate to provide enhanced performance over devices having comparable dimensions and manufactured on a bulk substrate. Incorporation of embedded capacitors into the SOI substrate, however, requires not only formation of deep trenches in the SOI substrate but also formation of a buried plate beneath a buried insulator layer, while preventing diffusion of dopants into a top semiconductor layer above the buried insulator layer.

In one prior art method, a doped silicate glass such as an arsenosilicate glass (ASG) layer is formed within a deep trench. The portion of the ASG layer above a top surface of the buried insulator layer is removed, which is followed by a drive-in anneal that diffuses arsenic into the handle substrate beneath the buried insulator layer to form a buried plate. The ASG layer is subsequently removed. Multiple processing steps employed in this prior art method incur significant cost and require considerable processing time.

In view of the above, there exists a need for methods of manufacturing a deep trench capacitor employing a more economical and less time consuming process sequence, and semiconductor structures enabling such a processing sequence.

SUMMARY OF THE INVENTION

The present invention addresses the needs described above by providing an economical and simple method of forming a deep trench capacitor that is embedded in a semiconductor-on-insulator (SOI) substrate, and a structure for effecting the same.

In the present invention, a deep trench is formed in two stages. In the first stage, the deep trench is formed to a depth substantially midway into a buried insulator layer of a semiconductor-on-insulator (SOI) substrate. A top semiconductor layer is laterally recessed by an isotropic etch that is selective to the buried insulator layer. In the second stage, the deep trench is etched below a bottom surface of the buried insulator layer. Ion implantation is performed at an angle into the deep trench to dope the sidewalls of the deep trench beneath the buried insulator layer, while the laterally recessed sidewalls of the top semiconductor layer are not implanted with dopant ions. A node dielectric and trench fill materials are deposited into the deep trench. A buried strap having an upper buried strap sidewall that is offset from a lower buried strap sidewall and a deep trench sidewall is formed to electrically connect the inner electrode of the deep trench to a recessed sidewall of the top semiconductor layer.

According to an aspect of the present invention, a deep trench capacitor is provided, which comprises:

a node dielectric located on a sidewall of a deep trench located in a semiconductor-on-insulator (SOI) substrate;

an inner electrode abutting an inner wall of the node dielectric;

a buried plate comprising a doped semiconductor material and abutting a bottom surface of a buried insulator layer and abutting an outer wall of the node dielectric; and a buried strap abutting the inner electrode and a top semiconductor layer and having an upper buried strap sidewall that is laterally offset from a lower buried strap sidewall and the outer wall of the node dielectric by a lateral offset.

In one embodiment, a bottom end of the upper buried strap sidewall and a top end of the lower buried strap sidewall are directly adjoined to a top surface of the buried insulator layer.

In another embodiment, the lower buried strap sidewall coincides with a portion of a sidewall of the buried insulator layer.

In even another embodiment, a first horizontal cross-section of the upper buried strap sidewall is a portion of a first ellipse, and a second horizontal cross-section of the lower buried strap sidewall is a portion of a second ellipse, and the first ellipse and the second ellipse are concentric.

In yet another embodiment, a first semiminor axis of the first ellipse is longer than a second semiminor axis of the second ellipse.

In still another embodiment, the lower buried strap sidewall is vertically coincident with the outer wall of the node dielectric.

In still yet another embodiment, the lateral offset is greater than the product of a thickness of the top semiconductor layer and a tangent of 1 degree.

In a further embodiment, a top surface of the inner electrode is coplanar with a top surface of the node dielectric.

In an even further embodiment, a top portion of the node dielectric is located on a sidewall of the buried insulator layer.

In a yet further embodiment, the inner electrode comprises a doped semiconductor material or a metal.

In a still further embodiment, the buried strap comprises a doped semiconductor material.

In further another embodiment, the semiconductor structure further comprises a shallow trench isolation (STI) structure having a shallow trench isolation (STI) sidewall that laterally abuts the buried strap and a shallow trench isolation (STI) bottom surface that vertically abuts the inner electrode.

In even further another embodiment, the STI structure vertically abuts a top surface of the buried insulator layer.

According to another aspect of the present invention, a method of forming a semiconductor structure is provided, which comprises:

forming a trench in a semiconductor-on-insulator (SOI) substrate, and a bottom surface of the trench directly adjoins a sidewall of a buried insulator layer;

laterally recessing a top semiconductor layer on the trench;

etching the trench deeper beneath a bottom surface of the buried insulator layer by an anisotropic etch; and forming a buried plate in a handle substrate by implanting a dopant into the trench at an angle, while preventing implantation of the dopant into the top semiconductor layer.

In one embodiment, an angle of implantation as measured from a vertical line is from about 1 degree to about 5 degrees.

In another embodiment, a top semiconductor sidewall of the top semiconductor layer is recessed from a sidewall of the trench by a lateral offset, and the lateral offset is greater than the product of a thickness of the top semiconductor layer and a tangent of 1 degree.

In even another embodiment, the lateral offset is greater than the product of a thickness of the top semiconductor layer and a tangent of 5 degrees.

In yet another embodiment, the method further comprises forming a stack of dielectric layers directly on a top surface of the SOI substrate, wherein the deep trench is formed through the stack and through the top semiconductor layer.

In still another embodiment, the stack comprises, from bottom to top, a pad oxide layer, a pad nitride layer, and a hardmask oxide layer.

In still yet another embodiment, the method further comprises:

applying a photoresist directly on the stack; and lithographically patterning the photoresist, wherein the photoresist contains a pattern for the trench.

In a further embodiment, the method further comprises:

forming a node dielectric layer directly on the buried plate;

forming an inner electrode within the node dielectric layer, wherein a top surface of the inner electrode is between a top surface of the buried insulator layer and the bottom surface of the buried insulator layer; and removing a portion of the node dielectric layer above the top surface of the inner electrode.

In an even further embodiment, the method further comprises:

depositing a doped semiconductor material directly on the top surface of the inner electrode and a top semiconductor sidewall of the top semiconductor layer; and recessing the doped semiconductor material below a top surface of the top semiconductor layer, wherein a remaining portion of the doped semiconductor material constitutes a buried strap.

In a yet further embodiment, the method further comprises:

removing a portion of the buried strap; and forming a shallow trench isolation structure directly on the buried strap, the sidewall of the buried insulator layer, and a top surface of the buried insulator layer.

In a still further embodiment, the buried strap comprises an upper buried strap sidewall and a lower buried strap sidewall separated by a lateral offset, and a bottom end of the upper buried strap sidewall and a top end of the lower buried strap sidewall are directly adjoined to a top surface of the buried insulator layer.

In a still yet further embodiment, the lower buried strap sidewall coincides with a portion of a sidewall of the buried insulator layer, wherein a first horizontal cross-section of the upper buried strap sidewall is a portion of a first ellipse, wherein a second horizontal cross-section of the lower buried strap sidewall is a portion of a second ellipse, and wherein the first ellipse and the second ellipse are concentric.

DETAILED DESCRIPTION OF THE INVENTION

Figure 1:
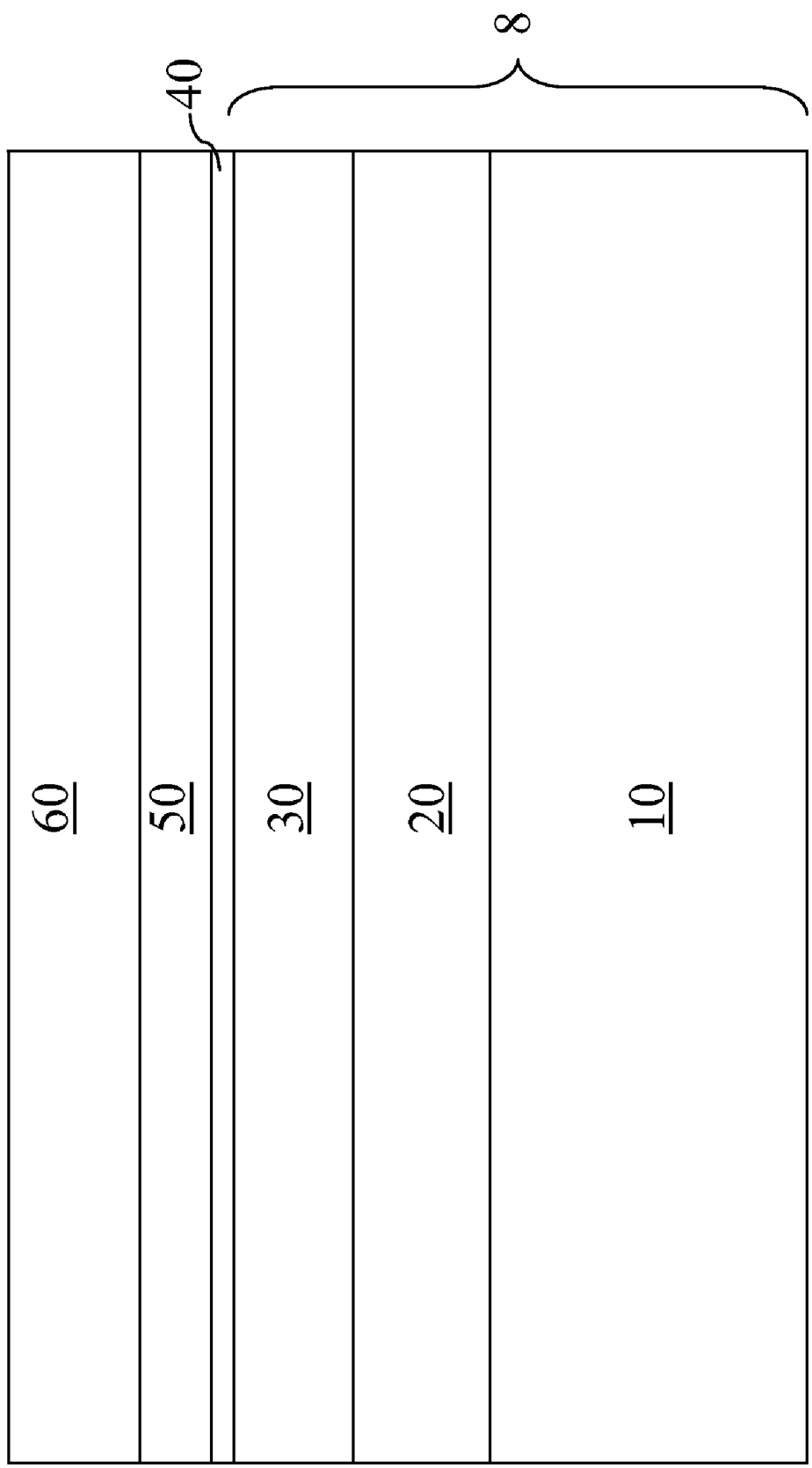
FIGS. 1, 2, 3A, 4-9, and 10A are sequential vertical cross-sectional views of an exemplary semiconductor structure according to the present invention.

As stated above, the present invention relates to a deep trench capacitor in a semiconductor-on-insulator (SOI) substrate having a laterally protruding buried strap and an ion implanted buried plate, and methods of manufacturing the same employing angled ion implantation and a lateral recess etch of a top semiconductor layer, which are now described in detail with accompanying figures. It is noted that like and corresponding elements mentioned herein and illustrated in the drawings are referred to by like reference numerals.

Referring to FIG. 1, an exemplary semiconductor structure according to the present invention comprises a semiconductor-on-insulator (SOI) substrate 8. The SOI substrate 8 contains a handle substrate 10, a buried insulator layer 20, and a top semiconductor layer 30. Each of the handle substrate 10 and the top semiconductor layer 30 comprises a semiconductor material, which may be selected from, but is not limited to, silicon, germanium, a silicon-germanium alloy, a silicon carbon alloy, a silicon-germanium-carbon alloy, gallium arsenide, indium arsenide, indium phosphide, III-V compound semiconductor materials, II-VI compound semiconductor materials, organic semiconductor materials, and other compound semiconductor materials. The handle substrate 10 and the top semiconductor layer 30 may comprise the same semiconductor material or different semiconductor materials. Preferably, each of the handle substrate 10 and the top semiconductor layer 30 comprises a single crystalline semiconductor material.

The handle substrate 10 may be undoped, or may have a p-type doping or an n-type doping at a low to medium level dopant concentration from about $1.0 \times 10^{13}/cm^3$ to about $3.0 \times 10^{17}/cm^3$. The thickness of the top semiconductor layer 30 may be from about 5 nm to about 300 nm, and preferably from about 20 nm to about 100 nm. The top semiconductor layer 30 may have a built-in biaxial stress in a horizontal plane, i.e., in the plane parallel to the interface between the buried insulator layer 20 and the top semiconductor layer 30. The buried insulator layer 20 comprises a dielectric material such as silicon oxide and/or silicon nitride. For example, the buried insulator layer 20 may comprise thermal silicon oxide. The thickness of the buried insulator layer 20 may be from about 20 nm to about 500 nm, and typically from about 100 nm to about 200 nm. The buried insulator layer 20 may be formed by methods well known in the art.

A stack of a pad oxide layer 40, a pad nitride layer 50, and a hardmask oxide layer 60 is sequentially formed on a top surface of the top semiconductor layer 30. The pad oxide layer 40 comprises a dielectric oxide. The pad oxide layer 40 may be formed by thermal oxidation of a portion of the top semiconductor layer 30 or by chemical vapor deposition. For example, the top semiconductor layer 30 may comprise silicon and the pad oxide layer 40 may comprise thermally grown silicon oxide. Alternately, the pad oxide layer 40 may be formed by chemical vapor deposition of a dielectric oxide material such as undoped silicate glass or a doped silicate glass. The thickness of the pad oxide layer 40 may be from about 3 nm to about 30 nm, and typically from about 6 nm to about 15 nm, although lesser and greater thicknesses are contemplated herein also.

The pad nitride layer 50 comprises a dielectric nitride. For example, the pad nitride layer 50 may comprise silicon nitride, which may be formed by chemical vapor deposition such as low pressure chemical vapor deposition (LPCVD), rapid thermal chemical vapor deposition (RTCVD), plasma enhanced chemical vapor deposition (PECVD), and high density plasma chemical vapor deposition (HDPCVD). The thickness of the pad nitride layer 50 may be from about 40 nm to about 300 nm, and typically from about 80 nm to about 150 nm, although lesser and greater thickness are contemplated herein also.

The hardmask oxide layer 60 comprises a dielectric oxide formed by chemical vapor deposition. For example, the hardmask oxide layer 60 may comprise an undoped silicate glass (USG) or a doped silicate glass such as borosilicate glass (BSG). The hardmask oxide layer 60 may be formed by chemical vapor deposition such as low pressure chemical vapor deposition (LPCVD), rapid thermal chemical vapor deposition (RTCVD), plasma enhanced chemical vapor deposition (PECVD), and high density plasma chemical vapor deposition (HDPCVD). The thickness of the hardmask oxide layer 60 may be from about 300 nm to about 1,200 nm, and typically from about 500 nm to about 1,000 nm, although lesser and greater thickness are contemplated herein also.

Figure 2:
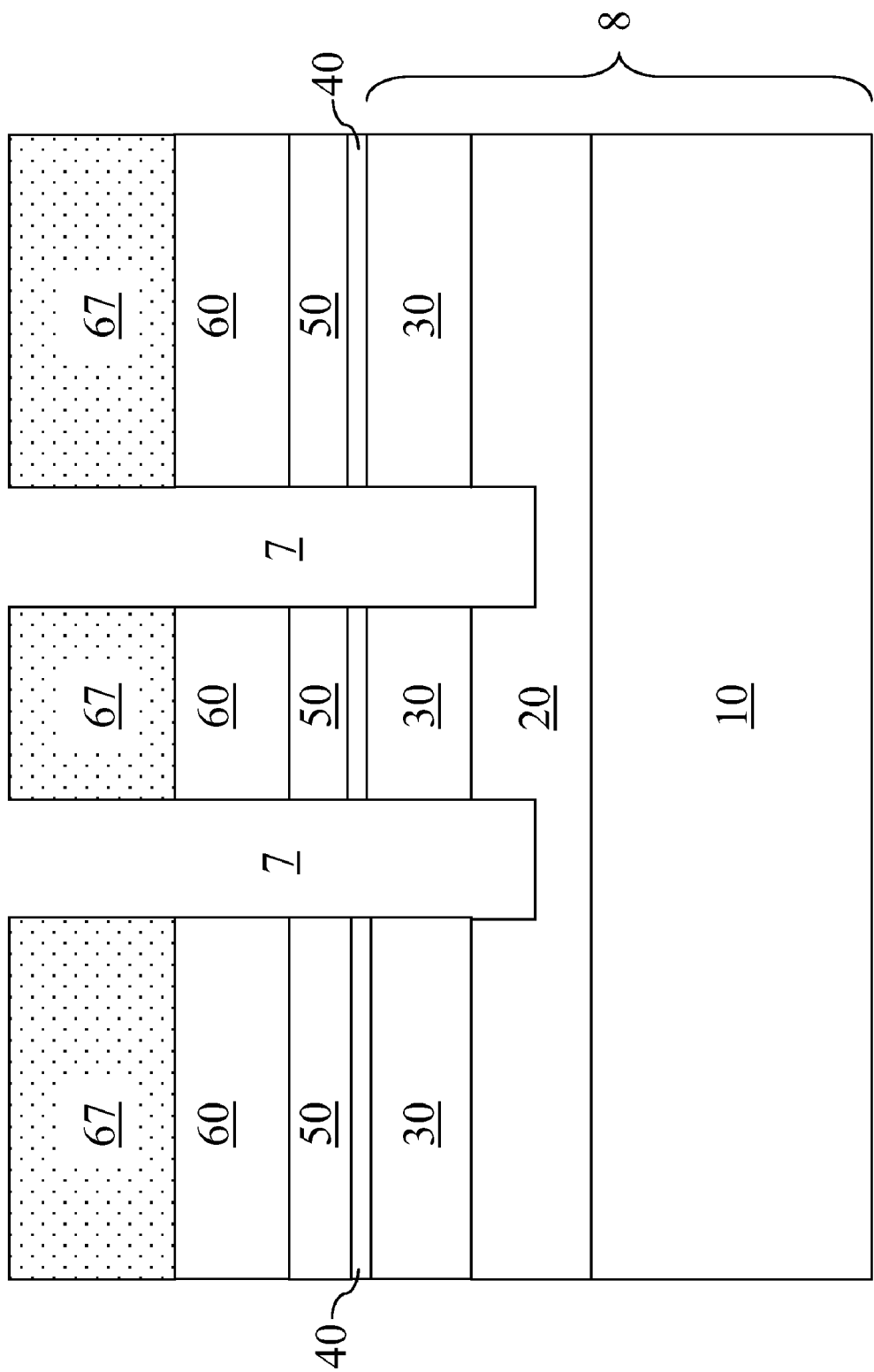

Referring to FIG. 2, a photoresist 67 is applied to a top surface of the hardmask oxide layer 60 and lithographically patterned to form openings in the photoresist 67. The shape of the openings may be a cross-section of an ellipse. The pattern in the openings in the photoresist 67 is transferred into the stack of the hardmask oxide layer 60, the pad nitride layer 50, and the pad oxide layer 40 by an anisotropic reactive ion etch. The pattern in the openings in the photoresist 67 is further transferred into the top semiconductor layer 30 and into the buried insulator layer 20 to form antecedent trenches 7.

The anisotropic reactive ion etch stops before reaching a bottom of the buried insulator layer 20, which may be effected by detecting exposure of the buried insulator layer 20 during the anisotropic reactive ion etch, followed by a limited overetch into the buried insulator layer 20. Thus, a bottom surface of the antecedent trenches 7 is directly adjoined to a sidewall of the buried insulator layer 20, i.e., the bottom surface of the antecedent trenches 7 is located between the top surface of the buried insulator layer 20 and the bottom surface of the buried insulator layer 20. A portion or all of the photoresist 67 may be consumed during the anisotropic reactive ion etch. If all of the photoresist 67 is consumed during the anisotropic reactive ion etch, the hardmask oxide layer 60 is utilized as an etch mask. Any remaining portion of the photoresist 67 is subsequently removed.

Figure 3A:
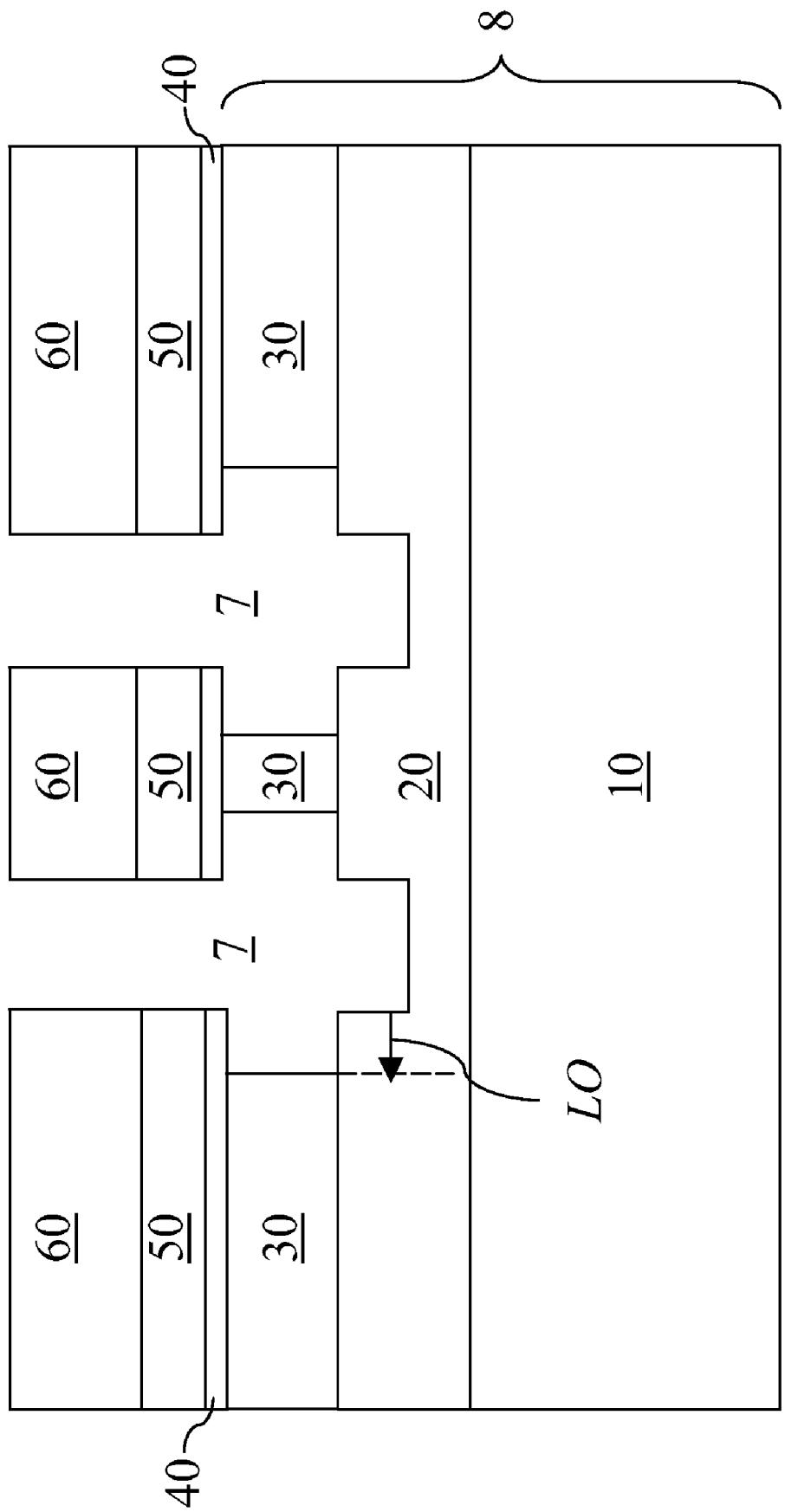
Figure 3B:
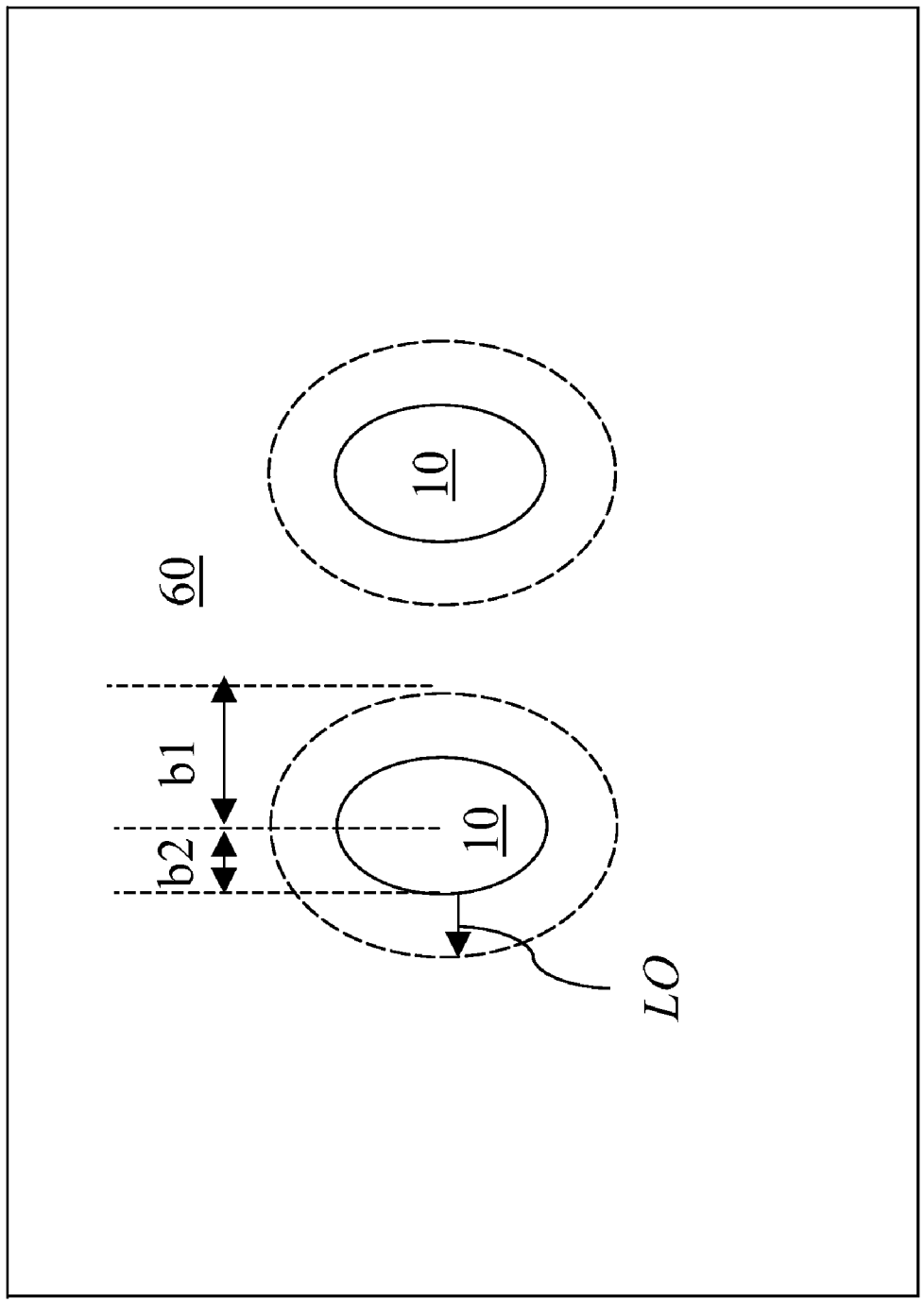
FIG. 3B is a top-down view corresponding to FIG. 3A.

Referring to FIGS. 3A and 3B, the top semiconductor layer is laterally recessed by an etch that is selective to the buried insulator layer 20. The etch may be a wet etch or a dry etch. Preferably, the etch is an isotropic etch. Sidewalls of the top semiconductor layer 30 are recessed outward relative to the sidewalls of the buried insulator layer 20. The sidewalls of the pad oxide layer 40, the pad nitride layer 50, and the hardmask oxide layer 60 may be substantially vertically coincident amongst themselves and with the sidewalls of the buried insulator layer 20.

The lateral offset LO of the sidewalls of the top semiconductor layer 30 relative to the sidewalls of the buried insulator layer 20 is optimized to enable complete shielding of dopant ions during a subsequent implantation to be employed to form buried plates. The angle of implantation, as measured from a vertical line, is from about 1 degree to about 5 degrees, and typically from about 2 degrees to about 3 degrees, although lesser and greater angles are explicitly contemplated herein. The lateral offset LO is greater than the product of the thickness of the top semiconductor layer 30 and the tangent of the angle of implantation. Thus, the lateral offset LO is greater than the product of the thickness of the top semiconductor layer 30 and the tangent of 1 degree. Preferably, the lateral offset LO is greater than the product of the thickness of the top semiconductor layer 30 and the tangent of 2 degrees, and more preferably, the lateral offset LO is greater than the product of the thickness of the top semiconductor layer 30 and the tangent of 5 degrees. The lateral offset LO, which is the distance between the sidewalls of the top semiconductor layer 30 and the sidewalls of the buried insulator layer, is uniform around the antecedent trenches 7.

In case the openings in the photoresist 67 (See FIG. 2) have a shape of an ellipse, cross-sectional areas of the antecedent trenches 7 are also ellipses irrespective of the location of the cross-section as long as the antecedent trenches 7 are captured in the cross-section. In a horizontal cross-section, the sidewalls of the top semiconductor layer 30 have a first cross-sectional shape, which is a first ellipse having a first semiminor axis of a first length b1. In another horizontal cross-section, the sidewalls of the buried insulator layer 20 have a second cross-sectional shape, which is a second ellipse having a second semiminor axis of a second length b2. The sum of the second length b2 and the lateral offset LO is the same as the first length b1. The first ellipse and the second ellipse are concentric.

Figure 4:
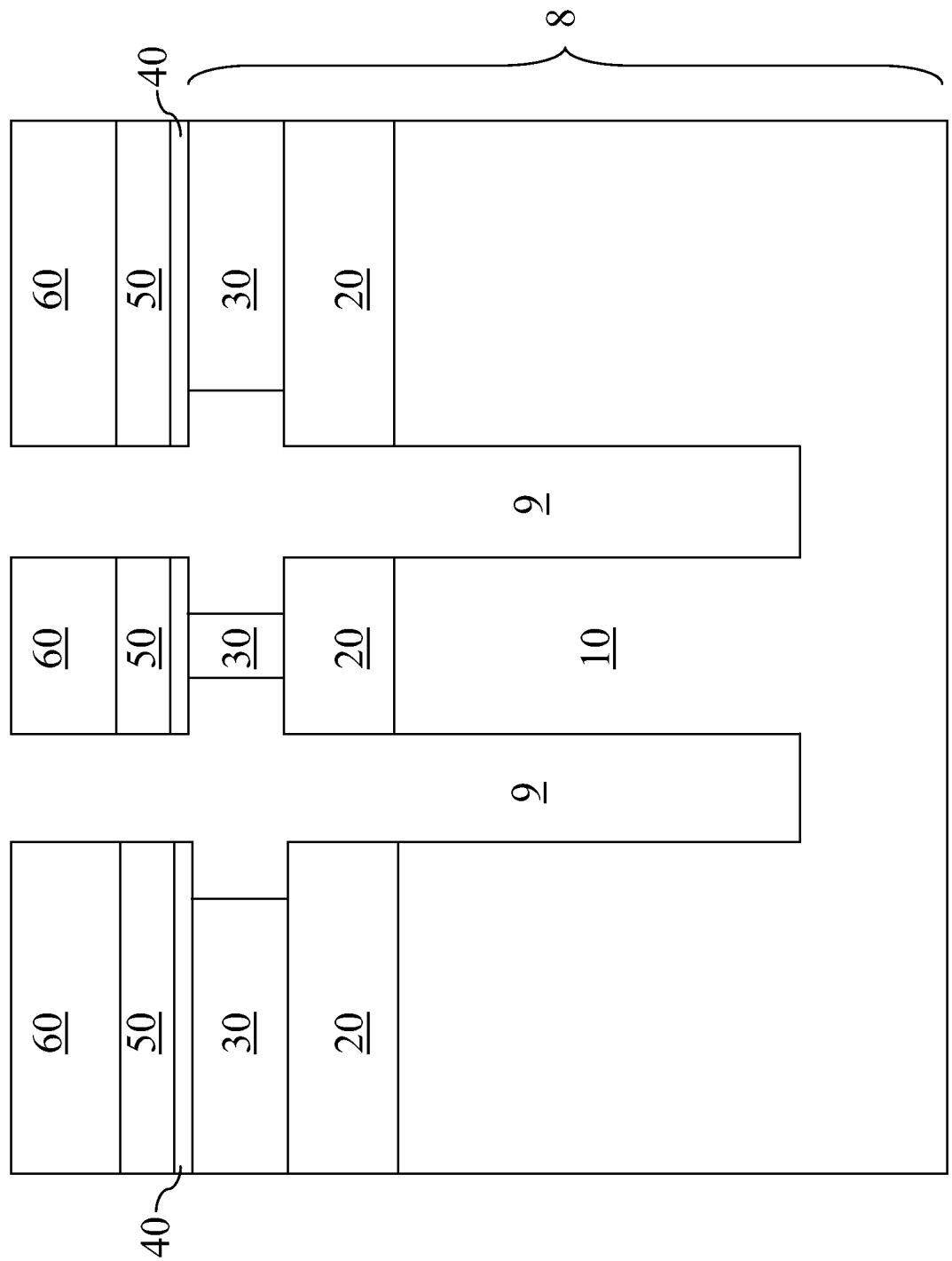

Referring to FIG. 4, the antecedent trenches 7 are further etched by an anisotropic etch beneath a bottom surface of the buried insulator layer 20 into the handle substrate 10 to form "deep trenches" 9. The term "deep trench" denotes a trench formed in a semiconductor substrate having a sufficient depth to form a capacitor. As such, a deep trench typically denotes a trench having a depth equal to or greater than 1 micron, whereas a shallow trench typically refers to a trench having a depth less than 1 micron. While the present invention is describes with a deep trench, the present invention may be employed with a trench having any depth into the handle substrate 10. Such variations are explicitly contemplated herein.

The hardmask oxide layer 60 is employed as an etch mask during the anisotropic etch, which is typically an anisotropic reactive ion etch. Chemistry for etching a deep trench employing a hardmask oxide layer is well known in the art. Portions of the hardmask oxide layer 60 is consumed during the anisotropic etch. The depth of the deep trenches 9, as measured from the top surface of the top semiconductor layer 30 to the bottom surface of the deep trenches, may be from about 1.5 micron to about 10 microns, and typically from about 2.5 microns to about 8 microns.

Figure 5:
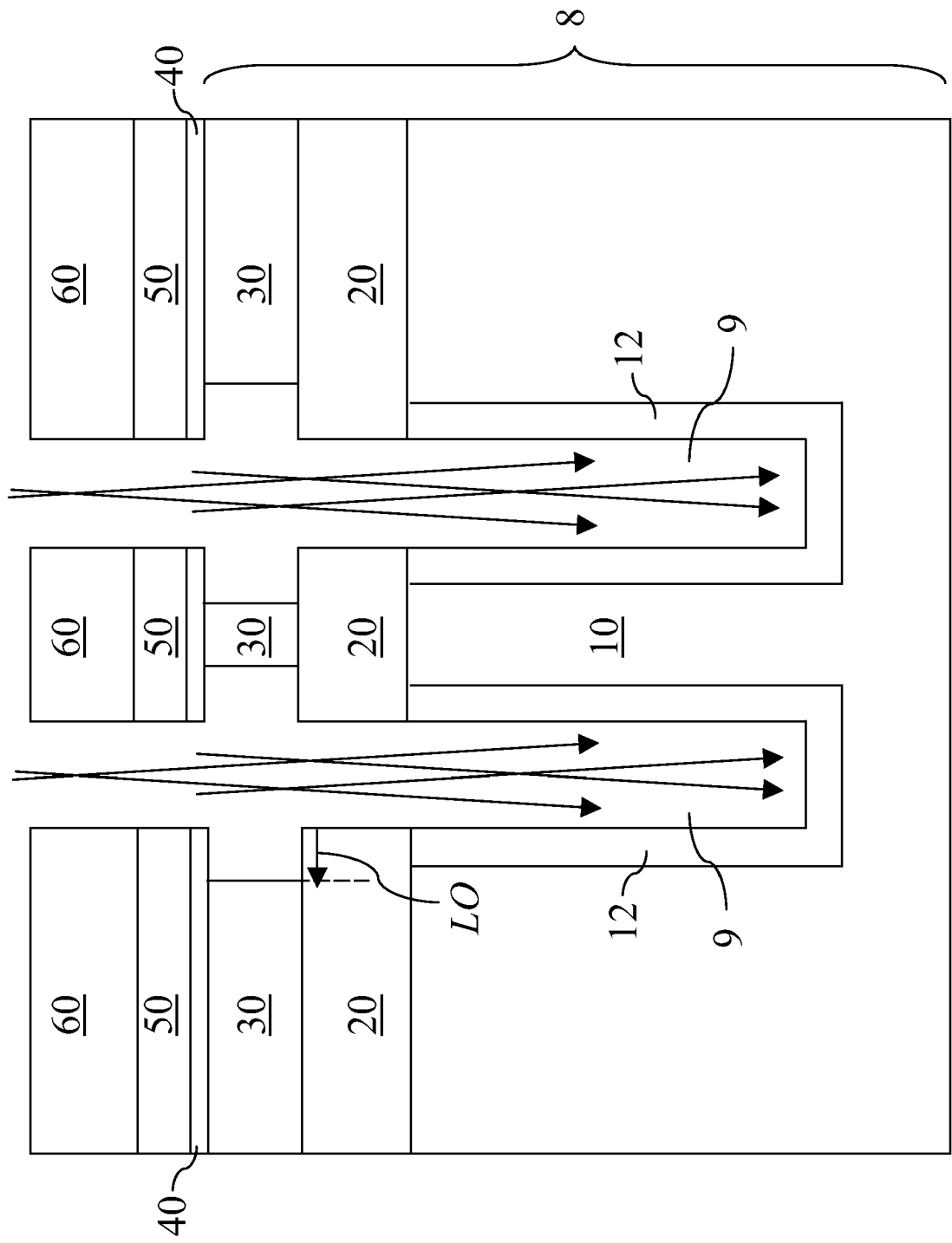

Referring to FIG. 5, dopants are implanted by multiple rounds of angled ion implantation to dope sidewalls of the deep trench 9 in the handle substrate 10 and to form buried plates 12. Typical dopants include As, P, Sb, B, Ga, and In. The angle of implantation, as measured from a vertical line, may be from about 1 degree to about 5 degrees, and typically from 2 degrees to about 3 degrees, although lesser and greater angles are explicitly contemplated also. Due to the lateral offset LO between the recessed sidewalls of the top semiconductor layer 30 and the sidewalls of the buried insulator layer 20 and a shielding effect of the stack of the hardmask oxide layer 60, the pad nitride layer 50, and the pad oxide layer 40, the dopants are not implanted into the top semiconductor layer 30.

During the multiple rounds of angled ion implantation, the direction of the tilt of the implanted ions is changed so that each of the buried plates 12 surrounds one of the deep trenches 9 at any depth between the bottom surface of the buried insulator layer 20 and the bottom surface of the deep trench 9 that the buried plate encloses. The dose and energy of the angled ion implantation are selected to provide a sufficiently high dopant concentration and volume to the buried plates 12, which is typically expanded during subsequent thermal treatments. Typical dopant concentration of the buried plates 12 after thermal treatments is from about $1.0 \times 10^{18}/cm^3$ to about $1.0 \times 10^{20}/cm^3$, although higher and lower dopant concentrations are explicitly contemplated herein also.

Lateral extent of the buried plates 12 as implanted, as measured from a sidewall of one of the deep trenches 9 to an outer wall of the buried plate 12 prior to a thermal treatment, may be from about 5 nm to about 100 nm, and typically from about 10 nm to about 50 nm, although lesser and greater lengths are also explicitly contemplated herein. Lateral extent of the buried plates 12 after a thermal treatment may be from about 5 nm to about 300 nm, and typically from about 10 nm to about 150 nm, although lesser and greater lengths are also explicitly contemplated herein.

The hardmask oxide layer 60 is subsequently removed. A suitable surface clean such as a wet clean may be performed at this point.

Figure 6:
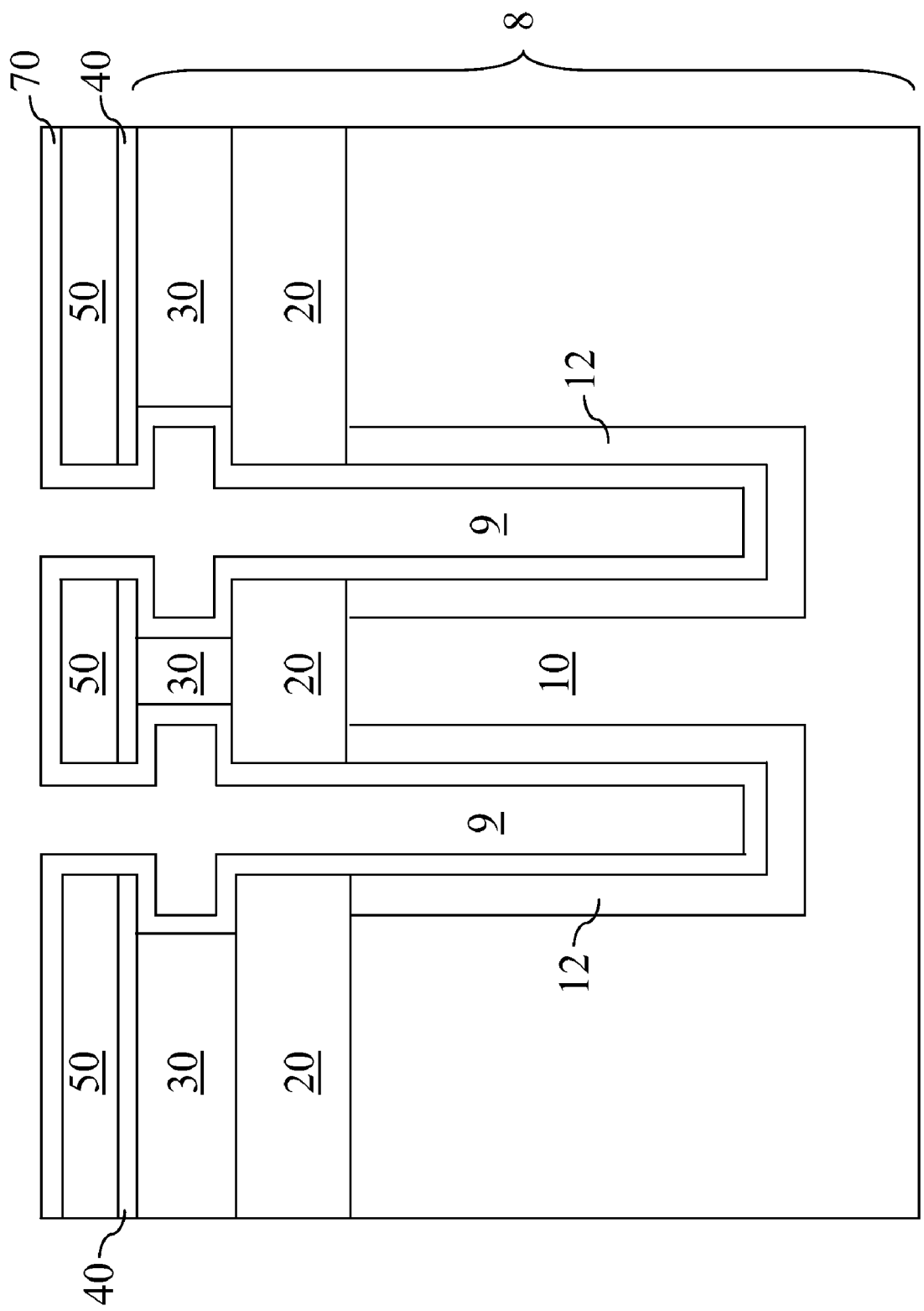

Referring to FIG. 6, a node dielectric layer 70 is formed directly on the buried plates 12, the sidewalls of the buried insulator layer 20, portions of the top surface of the buried insulator layer 20, the sidewalls of the top semiconductor layer 30, and on the stack of the pad nitride layer 50 and the pad oxide layer 40. The node dielectric layer 70 may comprise a dielectric nitride such as silicon nitride. The thickness of the silicon nitride may be from about 3 nm to about 6 nm. Alternately, the node dielectric layer 70 may comprise a high-k material having a dielectric constant greater than the dielectric constant of silicon nitride, which is about 7.5. Exemplary high-k materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from about 0.5 to about 3 and each value of y is independently from 0 to about 2. In this case, the thickness of the node dielectric layer 70 may be from about 2 nm to about 4 nm.

Figure 7:
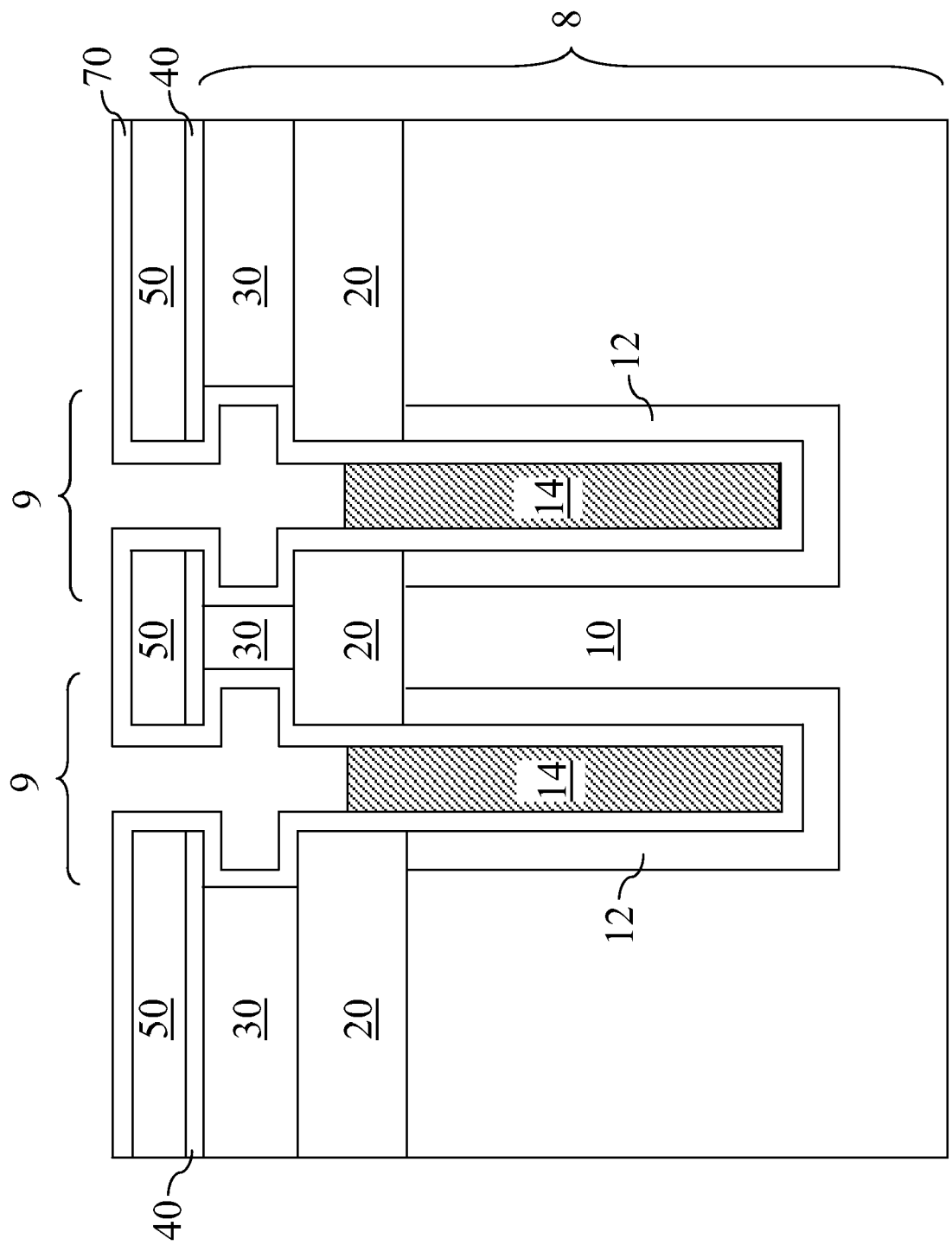

Referring to FIG. 7, an inner electrode 14 is formed by deposition of a conductive material on the inner walls of the node dielectric layer 70, followed by recessing of the conductive material to a depth between the top surface of the buried insulator layer 20 and the bottom surface of the insulator layer 20. The conductive material for the inner electrode 14 may be a doped semiconductor material or a metal.

In case the inner electrode 14 comprises a doped semiconductor material, the doped semiconductor material may comprise any material listed above for the handle substrate 10 or the top semiconductor layer 30. The dopants may be a p-type dopant or an n-type dopant. The doped semiconductor material may be deposited by chemical vapor deposition such as low pressure chemical vapor deposition (LPCVD).

In case the inner electrode 14 comprises a metal, the metal may be an elemental metal or a conductive metallic alloy. Exemplary elemental metals include Ta, Ti, Co, and W. Exemplary conductive metallic alloys include a mixture of elemental metals, a conductive metallic nitride such as TiN, ZrN, HfN, VN, NbN, TaN, WN, TiAlN, TaCN, and an alloy thereof. The inner electrode 14 may be formed by chemical vapor deposition (CVD), physical vapor deposition (PVD), atomic layer deposition (ALD), vacuum evaporation, etc.

Excess conductive material that is deposited outside the deep trenches 9 is removed by a recess etch or chemical mechanical planarization. The node dielectric layer 70 and/or the pad nitride layer 50 may be employed to sense an endpoint during the recess etch, or alternately, may be employed as a stopping layer during the chemical mechanical planarization. Once the excess conductive material is removed outside the deep trenches 9, the conductive material in the deep trenches 9 is recessed by an etch to a depth between the top surface of the buried insulator layer 20 and the bottom surface of the buried insulator layer 20. Preferably, the etch is isotropic to insure removal of the conductive material in the laterally expanded portion of the deep trenches 9 at the depth of the top semiconductor layer 30.

Figure 8:
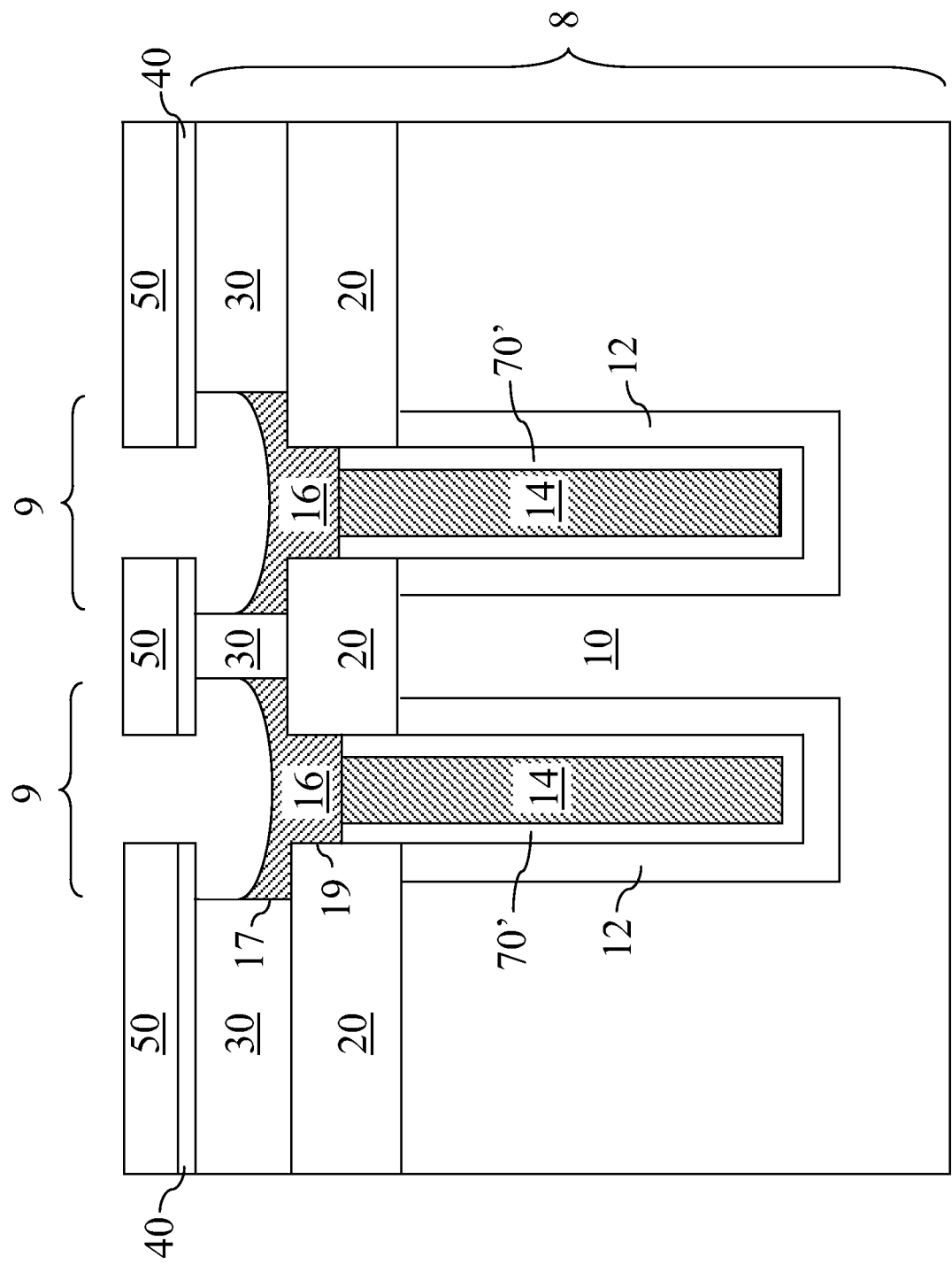

Referring to FIG. 8, the exposed portions of the node dielectric layer 70 is removed by a wet etch or a dry etch. Preferably, the etch is selective to the top semiconductor layer 30 and the buried insulator layer 20. In case the node dielectric layer 70 comprises silicon nitride, a wet etch employing ethylene glycol and hydrofluoric acid may be employed. Depending on the etch chemistry and composition of the pad nitride layer 50, a fraction of the pad nitride layer 70 may be etched during the removal of the node dielectric layer 70. The remaining portion of the node dielectric layer 70 underneath the top surface of the inner electrode 14 constitutes a node dielectric 70'. A top surface of the node dielectric 70' may be substantially coplanar with the top surface of the inner electrode 14.

Buried straps 16 are formed by deposition of a doped semiconductor material into the deep trenches 9, followed by planarization and recessing of the doped semiconductor material. The doped semiconductor material may comprise any material listed above for the handle substrate 10 or the top semiconductor layer 30. The dopants may be a p-type dopant or an n-type dopant. In case the inner electrode 14 comprises another doped semiconductor material, the doping types of the doped semiconductor materials are matched. The doped semiconductor material may be deposited by chemical vapor deposition such as low pressure chemical vapor deposition (LPCVD).

As in the formation of the inner electrodes 14, excess doped semiconductor material above the pad nitride layer 50 is removed by a recess etch or chemical mechanical planarization. The pad nitride layer 50 may be employed to indicate an endpoint during the recess etch, or alternately, may be employed as a stopping layer during the chemical mechanical planarization. Once the excess doped semiconductor material is removed above the pad nitride 50, the doped semiconductor material in the deep trenches 9 is recessed by a recess etch such that a top surface of the remaining doped semiconductor material at the center of each of the deep trenches 9 is above the top surface of the buried insulator layer 20. Preferably, the etch is isotropic so that the doped semiconductor material is etched laterally as well as vertically. Thus, a top portion of a sidewall of the top semiconductor layer 30 is exposed within each of the deep trenches 9. The remaining portion of the doped semiconductor material above the inner electrode 14 constitutes the buried straps 16.

Figure 9:
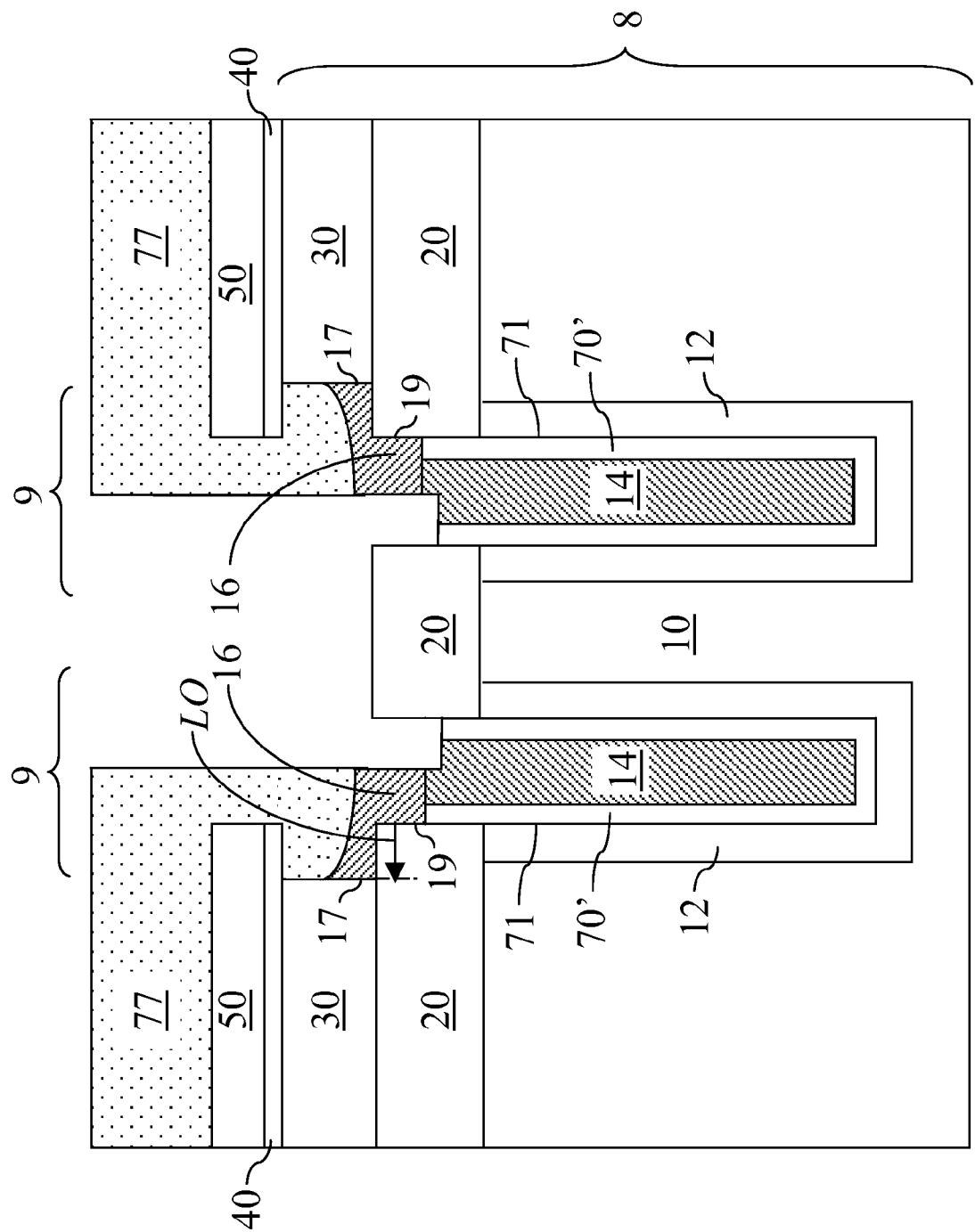

Referring to FIG. 9, a shallow trench is etched in a region containing a portion of each of the deep trenches 9 and the portion of the top semiconductor layer 30 therebetween. Specifically, a photoresist 77 is applied over the pad nitride layer 50 and the exposed portions of the buried straps 16 and lithographically patterned to form an opening that covers a fraction of each of the deep trenches 9 and the area between the two deep trenches 9. The exposed portions of the pad nitride layer 50, pad oxide layer 40, and the top semiconductor layer 30 within the opening are removed by an anisotropic etch. Further, exposed portions of the buried straps 16 within the opening in the photoresist 77 are also etched by the anisotropic etch. The anisotropic etch may be, or may not be, selective to the buried insulator layer 20.

Figure 10A:
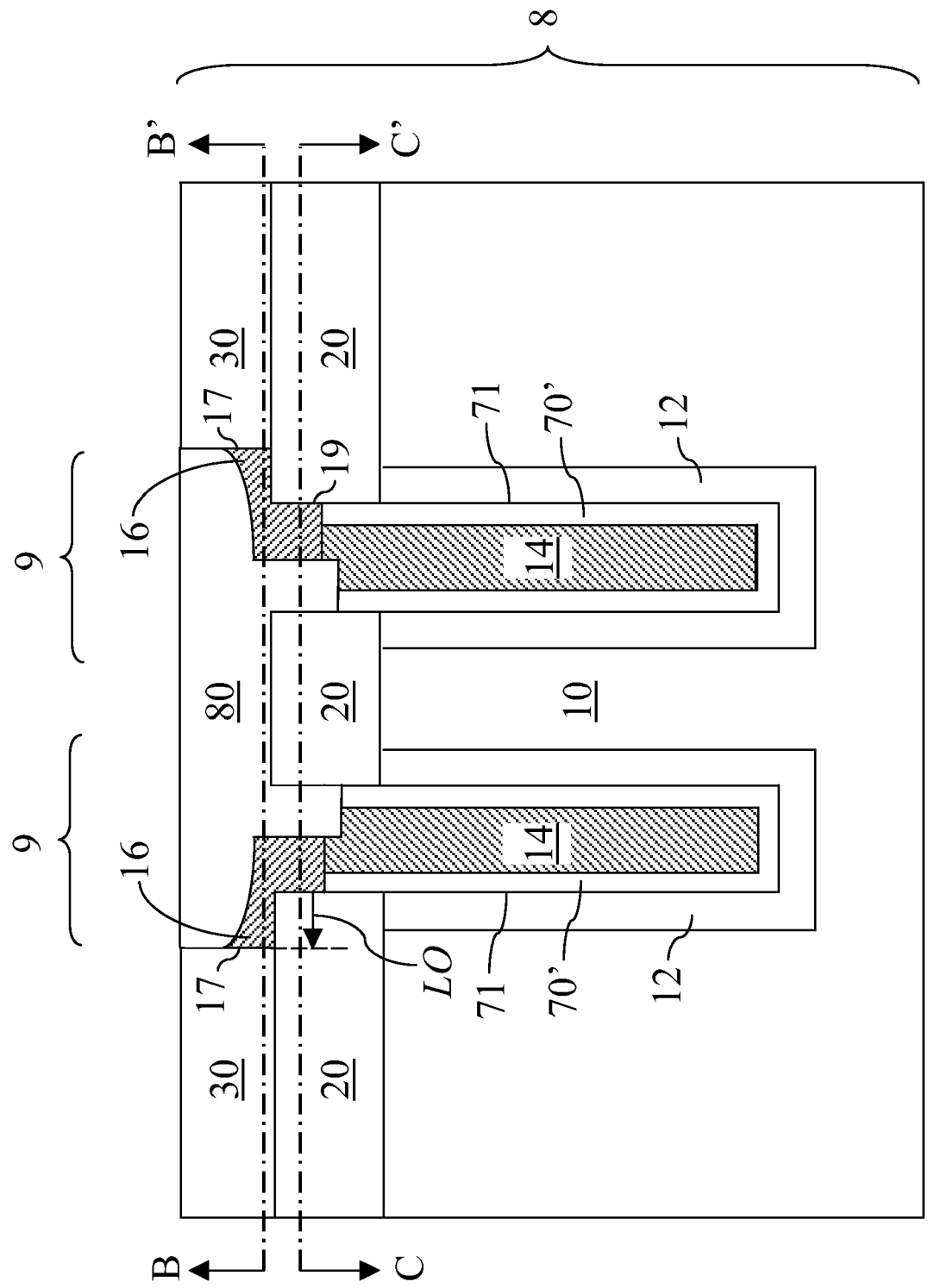
Figure 10B:
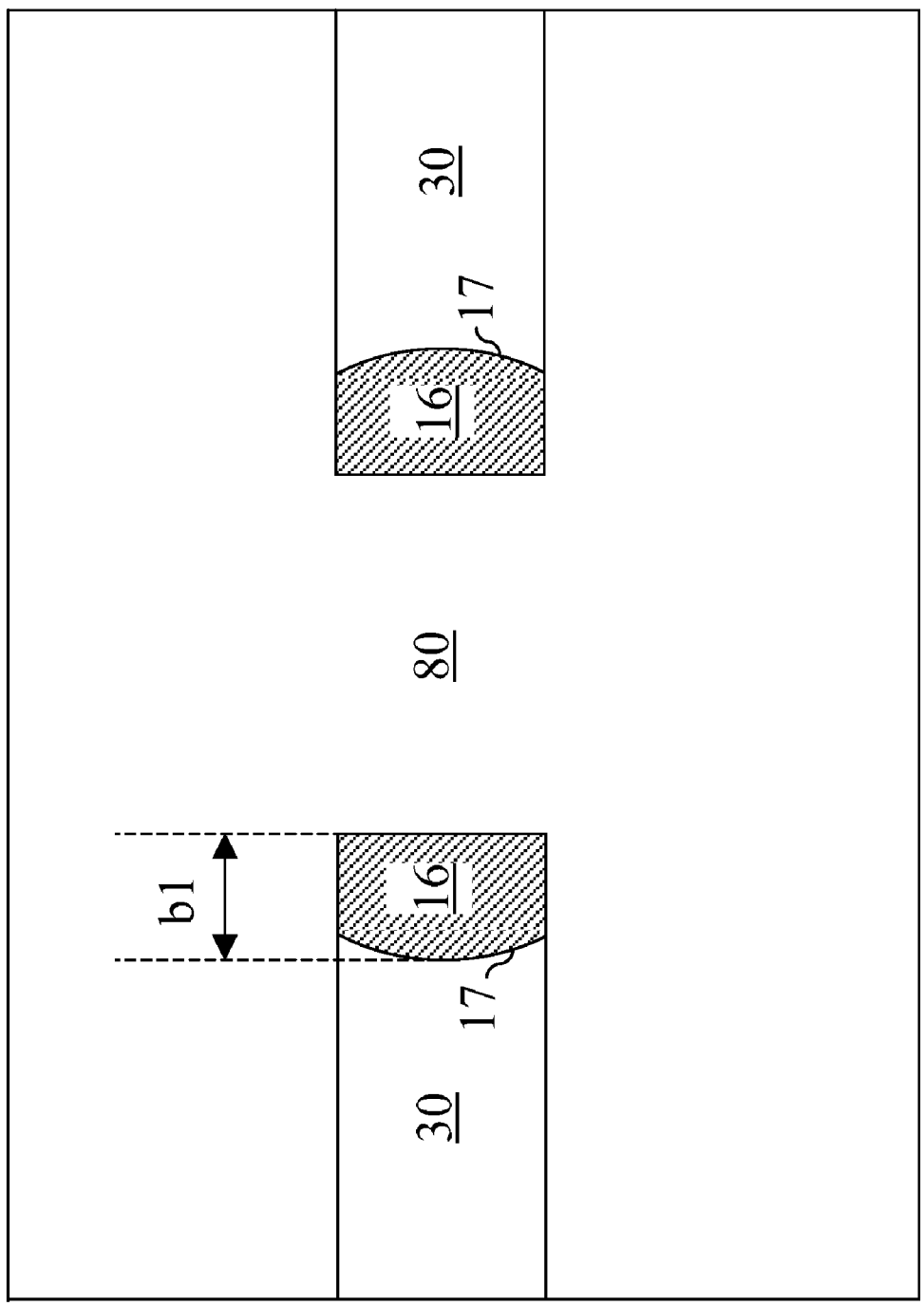
FIGS. 10B and 10C are horizontal cross-sectional views along the planes B-B' and C-C', respectively, in FIG. 10A.
Figure 10C:
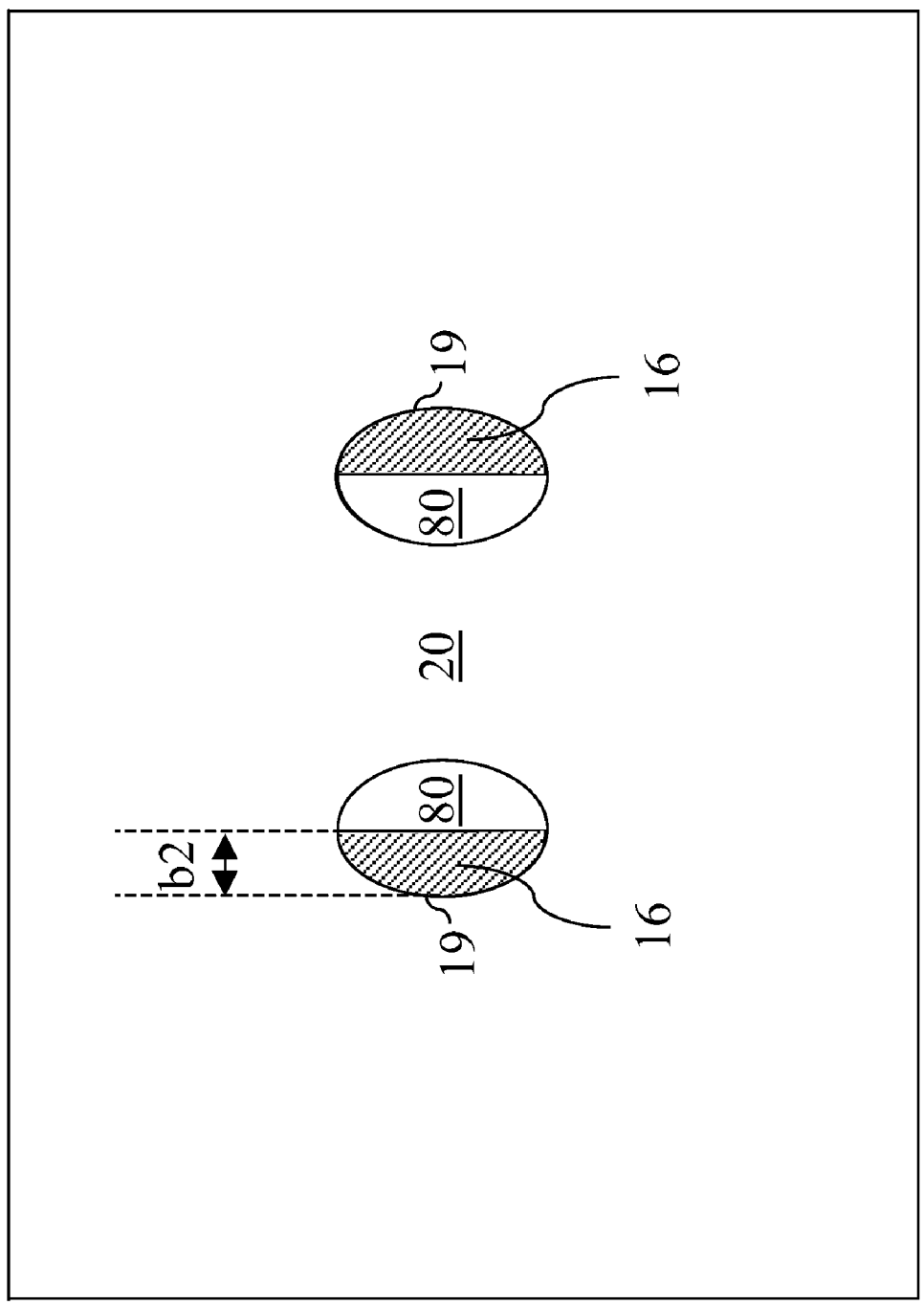

Referring to FIGS. 10A-10C, the photoresist 77 is removed, for example, by ashing. After a suitable surface clean, the cavity over the deep trenches is filled with a dielectric material and planarized to form a shallow trench isolation structure 80. The dielectric material may comprise a dielectric oxide or a dielectric nitride. For example, the dielectric material may comprise an undoped silicate glass that may be deposited by high density plasma chemical vapor deposition (HDPCVD), low pressure chemical vapor deposition (LPCVD), rapid thermal chemical vapor deposition (RTCVD), or plasma enhanced chemical vapor deposition (PECVD). The shallow trench isolation structure may comprise a dielectric liner (not shown) having a different composition than a fill material that is deposited on the dielectric liner.

The dielectric material is planarized employing the pad nitride layer 50 as a stopping layer. The remaining portion of the dielectric material is recessed relative to the pad nitride layer 50 to form the shallow trench isolation structure 80. The top surface of the shallow trench isolation structure 80 may be substantially coplanar with the top surface of the top semiconductor layer 30, or may be located above or below the top surface of the top semiconductor layer 30. The pad nitride layer 50 and the pad oxide layer 40 are subsequently removed.

The buried straps 16 provide an electrical connection between an inner electrode 14 and a portion of the top semiconductor layer so that a deep trench capacitor formed by a node dielectric 70', a buried plate 12, and an inner electrode 14 may be functionally connected to a device such as a transistor to be formed in the top semiconductor layer 30.

Each of the buried straps 16 abuts an inner electrode 14 and the top semiconductor layer 30, and has an upper buried strap sidewall 17 that is laterally offset from a lower buried strap sidewall 19 and the outer wall 71 of the node dielectric 70' by the lateral offset LO. A bottom end of the upper buried strap sidewall 17 and a top end of the lower buried strap sidewall 19 are directly adjoined to a top surface of the buried insulator layer 20. The lower buried strap sidewall 19 coincides with a portion of a sidewall of the buried insulator layer 20, which is vertically coincidental with the outer wall 71 of the node dielectric 70'.

A first horizontal cross-section of the upper buried strap sidewall 17 is a portion of a first ellipse, and a second horizontal cross-section of the lower buried strap sidewall 19 is a portion of a second ellipse, and the first ellipse and the second ellipse are concentric. The first semiminor axis b1 of the first ellipse is longer than a second semiminor axis b2 of the second ellipse.

The lower buried strap sidewall 19 is vertically coincident with the outer wall 71 of a node dielectric 70'. The lateral offset LO is greater than the product of a thickness of the top semiconductor layer 30 and a tangent of 1 degree. A top surface of the inner electrode 14 is substantially coplanar with a top surface of the node dielectric 70'. A top portion of each of the node dielectrics 70' is located on a sidewall of the buried insulator layer 20.

The shallow trench isolation (STI) structure 80 has a shallow trench isolation (STI) sidewall that laterally abuts each of the buried straps 16 and a shallow trench isolation (STI) bottom surface that vertically abuts the inner electrode 14. Also, the STI structure 80 vertically abuts a top surface of the buried insulator layer 20.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of forming a semiconductor structure comprising:
    forming a trench in a semiconductor-on-insulator (SOI) substrate, wherein a bottom surface of said trench directly adjoins a sidewall of a buried insulator layer;
    laterally recessing a top semiconductor layer on said trench;
    etching said trench deeper beneath a bottom surface of said buried insulator layer by an anisotropic etch; and
    forming a buried plate in a handle substrate by implanting a dopant into said trench at an angle, while preventing implantation of said dopant into said top semiconductor layer.

2. The method of claim 1, wherein an angle of implantation as measured from a vertical line is from about 1 degree to about 5 degrees.

3. The method of claim 1, wherein a top semiconductor sidewall of said top semiconductor layer is recessed from a sidewall of said trench by an lateral offset, wherein said lateral offset is greater than the product of a thickness of said top semiconductor layer and a tangent of 1 degree.

4. The method of claim 3, wherein said lateral offset is greater than the product of a thickness of said top semiconductor layer and a tangent of 5 degrees.

5. The method of claim 1, further comprising forming a stack of dielectric layers directly on a top surface of said SOI substrate, wherein said deep trench is formed through said stack and through said top semiconductor layer.

6. The method of claim 5, wherein said stack comprises, from bottom to top, a pad oxide layer, a pad nitride layer, and a hardmask oxide layer.

7. The method of claim 6, further comprising:
    applying a photoresist directly on said stack; and
    lithographically patterning said photoresist, wherein said photoresist contains a pattern for said trench.

8. The method of claim 1, further comprising:
    forming a node dielectric layer directly on said buried plate;
    forming an inner electrode within said node dielectric layer, wherein a top surface of said inner electrode is between a top surface of said buried insulator layer and said bottom surface of said buried insulator layer; and
    removing a portion of said node dielectric layer above said top surface of said inner electrode.

9. The method of claim 8, further comprising:
    depositing a doped semiconductor material directly on said top surface of said inner electrode and a top semiconductor sidewall of said top semiconductor layer; and recessing said doped semiconductor material below a top surface of said top semiconductor layer, wherein a remaining portion of said doped semiconductor material constitutes a buried strap.

10. The method of claim 9, further comprising:
removing a portion of said buried strap; and
forming a shallow trench isolation structure directly on said buried strap, said sidewall of said buried insulator layer, and a top surface of said buried insulator layer.

11. The method of claim 9, wherein said buried strap comprises an upper buried strap sidewall and a lower buried strap sidewall separated by a lateral offset, wherein a bottom end of said upper buried strap sidewall and a top end of said lower buried strap sidewall are directly adjoined to a top surface of said buried insulator layer.

12. The method of claim 11, wherein said lower buried strap sidewall coincides with a portion of a sidewall of said buried insulator layer, wherein a first horizontal cross-section of said upper buried strap sidewall is a portion of a first ellipse, wherein a second horizontal cross-section of said lower buried strap sidewall is a portion of a second ellipse, and wherein said first ellipse and said second ellipse are concentric.

* * * * *